US009912225B2

United States Patent
Schulz et al.

(10) Patent No.: US 9,912,225 B2
(45) Date of Patent: Mar. 6, 2018

(54) METHOD AND SYSTEM FOR OVERCURRENT PROTECTION FOR INSULATED-GATE BIPOLAR TRANSISTOR (IGBT) MODULES

(71) Applicant: Faraday & Future Inc., Gardena, CA (US)

(72) Inventors: Steven E. Schulz, Torrance, CA (US); David Tang, Rancho Cucamonga, CA (US); Silva Hiti, Redondo Beach, CA (US); Hector Romo, Santa Ana, CA (US); Marc Haeberlin, Los Angeles, CA (US)

(73) Assignee: FARADAY & FUTURE INC., Gardena, CA (US)

( * ) Notice: Subject to any disclaimer, the term of this patent is extended or adjusted under 35 U.S.C. 154(b) by 210 days.

(21) Appl. No.: 15/011,364

(22) Filed: Jan. 29, 2016

(65) Prior Publication Data

US 2017/0126115 A1    May 4, 2017

Related U.S. Application Data

(63) Continuation-in-part of application No. 14/929,173, filed on Oct. 30, 2015, now Pat. No. 9,762,146.

(51) Int. Cl.
*H02M 1/32*        (2007.01)
*H02M 7/538*       (2007.01)
(Continued)

(52) U.S. Cl.
CPC ........... *H02M 1/32* (2013.01); *B60L 11/1803* (2013.01); *H02M 7/53871* (2013.01);
(Continued)

(58) Field of Classification Search
CPC ....................................................... H02M 1/32
See application file for complete search history.

(56) References Cited

U.S. PATENT DOCUMENTS

| 5,200,878 | A | * | 4/1993 | Sasagawa | ........... | H03K 17/0828 |
| | | | | | | 361/101 |
| 5,706,189 | A | * | 1/1998 | Majumdar | ........... | H02M 7/5387 |
| | | | | | | 363/132 |

(Continued)

FOREIGN PATENT DOCUMENTS

| JP | 2011-152011 A | 8/2011 |
| JP | 2015-035850 A | 2/2015 |
| KR | 10-2006-0058791 A | 6/2006 |

OTHER PUBLICATIONS

International Search Report and Written Opinion dated Feb. 17, 2017, in corresponding International Application No. PCT/US2016/058415 (10 pages).

(Continued)

*Primary Examiner* — Yusef Ahmed
(74) *Attorney, Agent, or Firm* — Finnegan, Henderson, Farabow, Garrett & Dunner, LLP

(57) ABSTRACT

Circuits and methods for driving a load are disclosed. An exemplary driving circuit may include first and second switching devices electrically connected with each other in parallel. The driving circuit may also include a current sensing circuit configured to generate a current sensing signal indicating a value of a current flowing through the first switching device. The current sensing signal may include an offset caused by parasitic inductance imbalance in electrical connections connecting the first and second switching devices. The driving circuit may further include a driver circuit configured to control switching operations of the first and second switching devices. The driver circuit may include an overcurrent protection circuit electrically (Continued)

connected to the current sensing circuit. In addition, the driving circuit may include a current sensing signal correction circuit configured to reduce the offset in the current sensing signal received by the overcurrent protection circuit during a switching transient period.

17 Claims, 7 Drawing Sheets

(51) Int. Cl.
    *B60L 11/18*     (2006.01)
    *H02M 7/5387*     (2007.01)
    *H03K 17/082*     (2006.01)
    *H02M 1/00*     (2006.01)
    *H03K 17/08*     (2006.01)

(52) U.S. Cl.
    CPC . *H03K 17/0828* (2013.01); *H02M 2001/0009* (2013.01); *H03K 2017/0806* (2013.01)

(56) References Cited

U.S. PATENT DOCUMENTS

| | | | | |
|---|---|---|---|---|
| 6,215,634 | B1* | 4/2001 | Terasawa | H02M 3/33592 327/310 |
| 7,586,726 | B2* | 9/2009 | Maebara | H03K 17/0828 361/23 |
| 9,742,389 | B2* | 8/2017 | Maekawa | H03K 17/0828 |
| 2001/0026429 | A1* | 10/2001 | Fukuda | H03K 17/0828 361/93.9 |
| 2001/0028572 | A1* | 10/2001 | Takanashi | H02M 1/08 363/58 |
| 2003/0048648 | A1 | 3/2003 | Lin et al. | |
| 2007/0035284 | A1* | 2/2007 | Schoofs | H02M 3/1584 323/283 |
| 2007/0218595 | A1* | 9/2007 | Yoshimura | H01F 19/08 438/138 |
| 2012/0075753 | A1* | 3/2012 | Watanabe | B60L 15/007 361/18 |
| 2012/0075761 | A1* | 3/2012 | Miura | H02M 1/32 361/93.1 |
| 2012/0153719 | A1* | 6/2012 | Inaba | B60L 3/003 307/10.1 |
| 2012/0206174 | A1* | 8/2012 | Maruyama | H03K 17/0828 327/109 |
| 2012/0217937 | A1* | 8/2012 | Miyauchi | H03K 17/0828 322/28 |
| 2012/0224288 | A1* | 9/2012 | Uota | H03K 17/18 361/79 |
| 2012/0235488 | A1* | 9/2012 | Hamanaka | H02M 1/32 307/64 |
| 2014/0307495 | A1* | 10/2014 | Fukuta | H02H 3/08 363/98 |
| 2014/0362490 | A1* | 12/2014 | Maekawa | H03K 17/0828 361/103 |
| 2014/0375333 | A1* | 12/2014 | Minagawa | H02M 1/08 324/537 |
| 2015/0145462 | A1 | 5/2015 | Ulrich et al. | |
| 2015/0188410 | A1* | 7/2015 | Takagiwa | H02M 1/32 363/56.02 |
| 2015/0236686 | A1* | 8/2015 | Senda | H03K 17/0828 327/381 |
| 2015/0340355 | A1* | 11/2015 | Zhang | G01R 19/00 361/86 |
| 2016/0142048 | A1* | 5/2016 | Zoels | H02M 1/08 327/109 |
| 2017/0040802 | A1* | 2/2017 | Hopperdietzel | G01R 15/183 |
| 2017/0054439 | A1* | 2/2017 | Sasaki | H03K 17/28 |

OTHER PUBLICATIONS

Application Note 5SYA 2098-00, "Paralleling of IGBT modules," ABB Switzerland Ltd. Semiconductors, Aug. 2013.

* cited by examiner

METHOD AND SYSTEM FOR OVERCURRENT PROTECTION FOR INSULATED-GATE BIPOLAR TRANSISTOR (IGBT) MODULES

CROSS-REFERENCE TO RELATED APPLICATIONS

The present application is a Continuation-In-Part (CIP) of U.S. patent application Ser. No. 14/929,173, filed Oct. 30, 2015, the entire content of which is incorporated herein by reference.

TECHNICAL FIELD

The present disclosure relates generally to driving circuits and, more specifically, to driving circuits utilizing insulated-gate bipolar transistor (IGBT) modules.

BACKGROUND

Electric and hybrid vehicle propulsion systems typically employ an alternating current (AC) driving circuit, such as an inverter, to convert direct current (DC) voltage of an energy storage battery to variable speed AC waveforms to drive an electric motor. The driving circuit often has a current controlled voltage source configuration. Power electronic devices such as insulated gate bipolar transistors (IGBTs) can be used as switches to construct AC voltages for driving the electric motor by chopping the DC voltage according to a pulse width modulation (PWM) scheme.

The torque output of an electric motor is roughly proportional to the current applied to the electric motor. Therefore, in order to obtain a high torque, a large amount of current needs to be applied to the electric motor by the driving circuit. On the other hand, overcurrent should be monitored to prevent damaging the power electronic devices of the driving circuit. Thus, it is desirable to develop a driving circuit to provide high current output and at the same time to accurately monitor overcurrent conditions.

SUMMARY

In one aspect, the present disclosure is directed to a driving circuit for driving a load. The driving circuit may include first and second switching devices electrically connected with each other in parallel. The driving circuit may also include a current sensing circuit configured to generate a current sensing signal indicating a value of a current flowing through the first switching device. The current sensing signal may include an offset caused by parasitic inductance imbalance in electrical connections connecting the first and second switching devices. The driving circuit may further include a driver circuit electrically connected to the first and second switching devices and configured to control switching operations of the first and second switching devices. The driver circuit may include an overcurrent protection circuit electrically connected to the current sensing circuit for receiving the current sensing signal. In addition, the driving circuit may include a current sensing signal correction circuit configured to reduce the offset in the current sensing signal received by the overcurrent protection circuit during a switching transient period.

In another aspect, the present disclosure is directed to a method for driving a load. The method may include electrically connecting first and second switching devices in parallel. The method may also include generating, by a current sensing circuit, a current sensing signal indicating a value of a current flowing through the first switching device. The current sensing signal may include an offset caused by parasitic inductance imbalance in electrical connections connecting the first and second switching devices. The method may further include reducing, by a current sensing signal correction circuit, the offset in the current sensing signal during a switching transient period. In addition, the method may include receiving, by an overcurrent protection circuit of a driver circuit, the current sensing signal having the reduced offset for protecting the first switching device from overcurrent.

In a further aspect, the present disclosure is directed to an inverter for driving a motor of an electric vehicle. The inverter may include first and second IGBT switches electrically connected with each other in parallel. The inverter may also include a current sensing circuit configured to generate a current sensing signal indicating a value of a current flowing through the first IGBT switch. The current sensing signal may include an offset caused by parasitic inductance imbalance in electrical connections connecting the first and second IGBT switches. The inverter may further include a driver circuit electrically connected to the first and second IGBT switches and configured to control switching operations of the first and second IGBT switches. The driver circuit may include an overcurrent protection circuit electrically connected to the current sensing circuit for receiving the current sensing signal. In addition, the inverter may include a current sensing signal correction circuit configured to reduce the offset in the current sensing signal received by the overcurrent protection circuit during a switching transient period.

Additional objects and advantages of the present disclosure will be set forth in part in the following detailed description, and in part will be obvious from the description, or may be learned by practice of the present disclosure. The objects and advantages of the present disclosure will be realized and attained by means of the elements and combinations particularly pointed out in the appended claims.

The foregoing general description and the following detailed description are exemplary and are not restrictive to the claims.

BRIEF DESCRIPTION OF THE DRAWINGS

Certain embodiments of the present disclosure are illustrated by the accompanying figures. These figures are not necessarily to scale. Details not necessary for understanding the technology or rendering other details difficult to perceive may be omitted. The technology is not necessarily limited to the particular embodiments illustrated herein.

DETAILED DESCRIPTION

Figure 1:
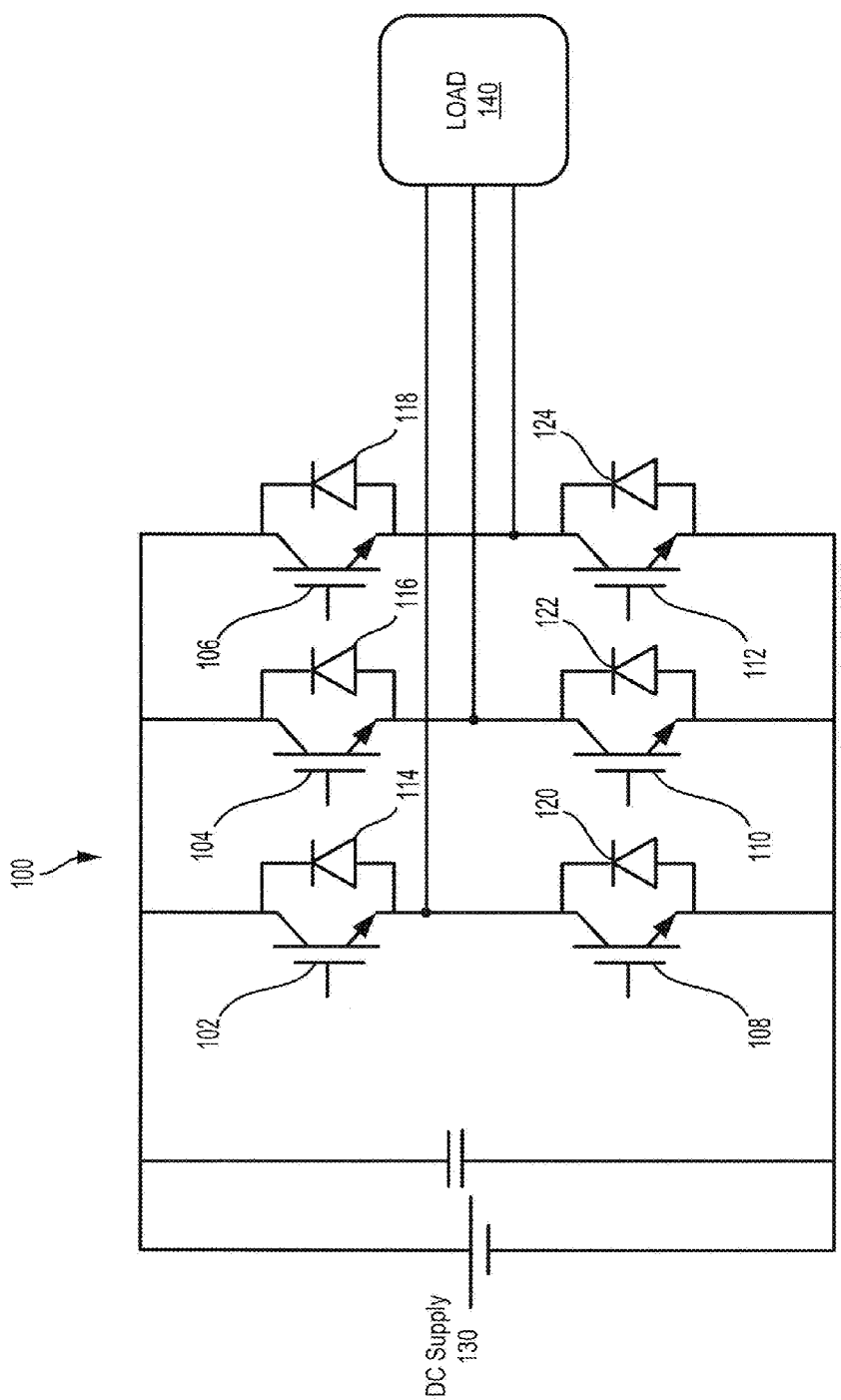
FIG. 1 is a circuit diagram illustrating an exemplary three phase inverter, according to some disclosed embodiments.

Embodiments disclosed in the present application can be in many different forms. Specific embodiments and drawings described herein in detail are exemplary and are not limiting.

The terminology used herein is for the purpose of describing particular embodiments only and is not intended to be limiting of the present disclosure. As used herein, the singular forms "a," "an," and "the" are intended to include the plural forms as well, unless the context clearly indicates otherwise. Terms such as "comprises" and "comprising," when used in this specification, specify the presence of stated features, integers, steps, operations, elements, and/or components, but do not preclude the presence or addition of one or more other features, integers, steps, operations, elements, components, and/or groups thereof.

Like or analogous elements and/or components, referred to herein, may be identified throughout the drawings with like reference characters. Figures are merely schematic representations of the present disclosure. As such, some of the components may have been distorted from their actual scale for pictorial clarity.

Some embodiments of the present disclosure are directed to a method for interconnecting IGBT modules to provide high current output. The IGBT modules can be used in inverters configured to convert DC voltage of an energy storage battery to variable speed AC waveforms to drive an electric motor. An exemplary inverter assembly is described in U.S. patent application Ser. No. 14/841,520, filed Aug. 31, 2015, and titled "Inverter Assembly," the entire content of which is incorporated herein by reference.

Some embodiments of the present disclosure may facilitate reduction in the number of driver circuits configured to drive IGBT switches connected in parallel. As used herein, a driver circuit may include a driver integrated circuit (IC) or a driver including discrete components. An exemplary configuration may employ a driver circuit to control a pair of IGBT switches selected from a plurality of IGBT modules. As used herein, an IGBT module refers to an integrated hardware module that may include one or more IGBT switches. The pair of IGBT switches include a first IGBT switch and a second IGBT switch. The first IGBT switch, the second IGBT switch, and the driver circuit can be electrically coupled or connected to allow the first IGBT switch and the second IGBT switch to receive at least one gate command signal from the driver circuit. In this disclosure, the terms "electrically coupled" and "electrically connected" are used interchangeably and refer to an interconnection state in which electrons are capable of moving or signals are capable of transmitting between a first location A and a second location B that are electrically coupled or connected. For example, A and B may be physically or directly connected by a conductor or conductive material. In another example, one or more circuit components, such as resistors, inductors, capacitors, or other passive or active components may be interconnected between A and B. As long as electrical signals can be transmitted between A and B (e.g., through the intermediate components), A and B are deemed to be electrically connected/coupled.

The first and second IGBT switches may be electrically connected to the driver circuit by connecting the gate terminals of the first and second IGBT switches to a gate command terminal or pin of the driver circuit. The first IGBT switch may include at least one protective circuit, such as a current protection circuit, a temperature protection circuit, etc. The first IGBT switch may be electrically coupled to the driver circuit to allow the driver circuit to receive a protection signal from the at least one protective circuit of the first IGBT switch. For example, one or more terminals of the protective circuit(s) may be connected to corresponding terminal(s)/pin(s) of the driver circuit. The second IGBT switch may also include one or more protective circuits. In some embodiments, the protective circuit(s) of the second IGBT switch may not be coupled to the driver circuit. In such embodiments, a single driver circuit may control both the first and second IGBT switches by supplying gate command signals to the gate terminals of both IGBT switches and receiving protection signals from only the first IGBT switch.

FIG. 1 is a circuit diagram illustrating an exemplary three phase inverter 100. Inverter 100 may be configured to convert a DC voltage into an AC voltage. As shown in FIG. 1, inverter 100 may include six IGBT switches: 102, 104, 106, 108, 110, and 112, which are coupled with six diodes: 114, 116, 118, 120, 122, and 124, respectively. Among the six IGBT switches, 102, 104, and 106 are referred to as upper IGBT switches or upper leg devices because the collector terminals of these three upper IGBT switches are connected to the positive terminal of a DC supply 130, while 108, 110, and 112 are referred to as lower IGBT switches or lower leg devices because the emitter terminals of these three lower IGBT switches are connected to the negative terminal of DC supply 130. The emitter terminal of IGBT switch 102 may be connected together with the collector terminal of IGBT switch 108 and both terminals may also be connected to one phase (e.g., phase A) of a three-phase load 140. Similarly, the emitter terminal of IGBT switch 104 may be connected to the collector terminal of IGBT switch 110 and both terminals may be connected to phase B; the emitter terminal of IGBT switch 106 may be connected to the collector terminal of IGBT switch 112 and both terminals may be connected to phase C. The IGBT switches may be configured to convert the DC voltage supplied by DC supply 130 into three-phase AC voltages to drive load 140 (e.g., an electric motor). For example, the IGBT switches may be turned on and off according to a PWM scheme to construct the three-phase AC voltages by chopping the DC voltage into voltage segments having different durations.

In some embodiments, to output a high current to load 140, two or more IGBT devices may be connected in parallel. If each IGBT device can conduct a maximum current $I_m$, then N IGBT devices connected in parallel can theoretically conduct a maximum current $N \times I_m$. Various methods of parallel connection may be used. For example, two IGBT switches may be connected in parallel (each with an integral diode) to form a switching device. In this case, inverter 100 shown in FIG. 1 may include 12 individual IGBT switches forming six switching devices, each switching device including two IGBT switches connected in parallel. In another example, half-bridge modules may be used. Each half-bridge module may include an upper switch, a lower switch, and diodes in a single package. Six half-bridge modules may form a three-phase inverter, with two half-bridge modules connected in parallel for each phase. In another example, hexpack power modules may be used. Each hexpack power module may include six IGBT switches. Two hexpack power modules may be connected in parallel to expand the current handling capacity. Regardless of which interconnection approach is adopted, with proper packaging and electrical design, IGBT devices connected in parallel can be configured to share the load current relatively equally.

Figure 2:
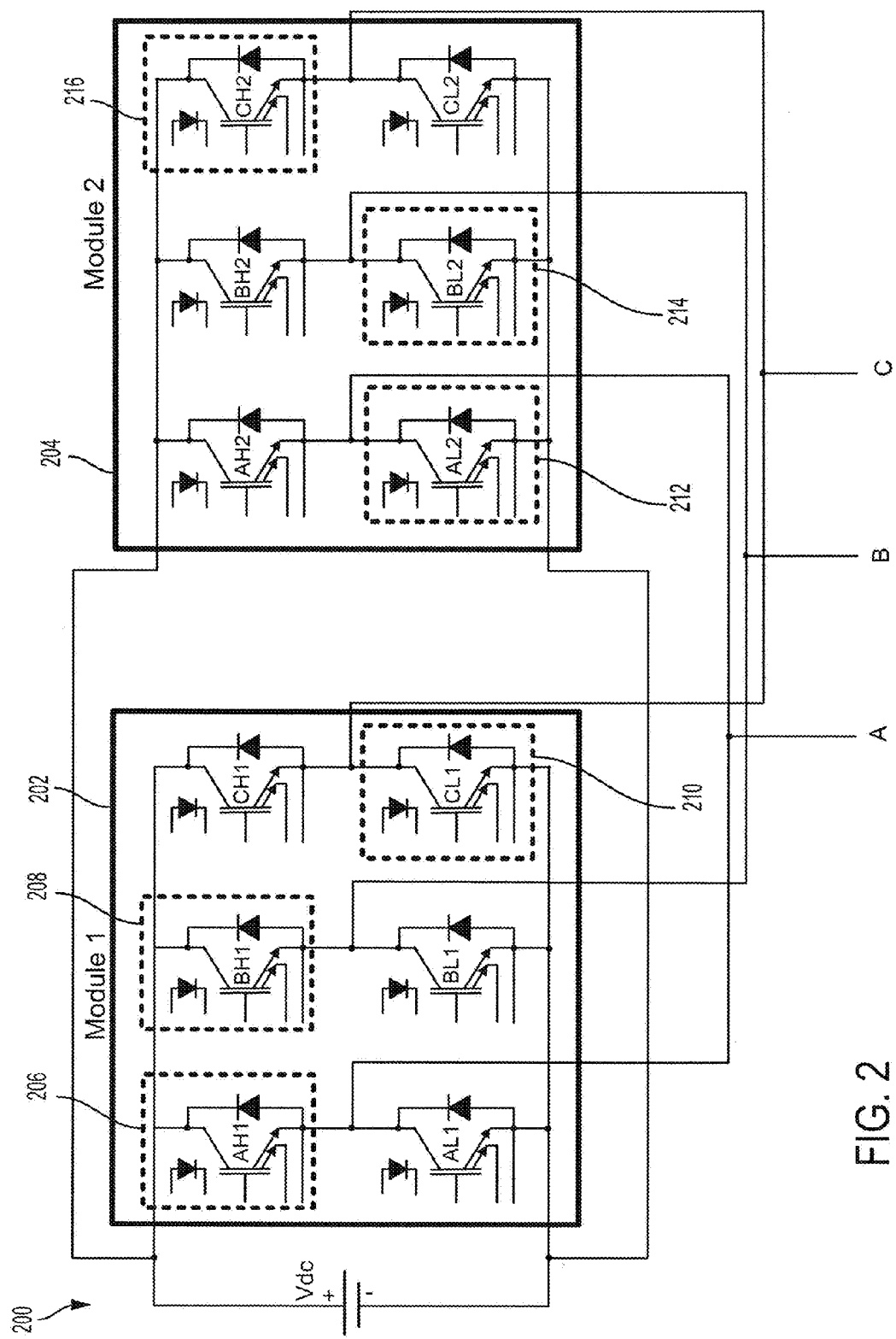
FIG. 2 is a circuit diagram illustrating an exemplary inverter including two hexpack power modules connected in parallel, according to some disclosed embodiments.

FIG. 2 is a circuit diagram illustrating an exemplary inverter 200 including two hexpack power modules connected in parallel, according to some disclosed embodiments. As shown in FIG. 2, hexpack power modules 202 (Module 1) and 204 (Module 2) each includes six IGBT switches and six diodes. The six IGBT switches of each hexpack power module may be denoted according to their topological positions, corresponding phases, and module numbers. For example, in module 1, the upper IGBT switch connected to phase A may be denoted as AH1, while the lower IGBT switch connected to phase A may be denoted as AL1. The upper and lower IGBT switches connected to other phases and/or within module 2 may be similarly denoted.

As shown in FIG. 2, parallel connecting modules 1 and 2 includes connecting the collector terminals of all upper IGBT switches together within each module and between both modules, connecting the emitter terminals of all lower IGBT switches together within each module and between both modules, and connecting corresponding phase outputs together between both modules. In addition, corresponding IGBT switches in modules 1 and 2 can be controlled by a single driver circuit. For example, AH1 and AH2 may be controlled by a single driver circuit by connecting the gate terminals of AH1 and AH2 to a gate command terminal or pin of the driver circuit.

While both AH1 and AH2 can be controlled by a single driver circuit, one IGBT switch may be selected as a master device and the other as a slave device. The selection of master/slave devices may depend on many factors. For example, a master device may provide operational feedback to the driver circuit while the slave device may not. In this case, operational parameter sensors, such as a current sensor and a temperature sensor, of the master device may be connected to corresponding terminal(s)/pin(s) of the driver circuit.

Figure 3:
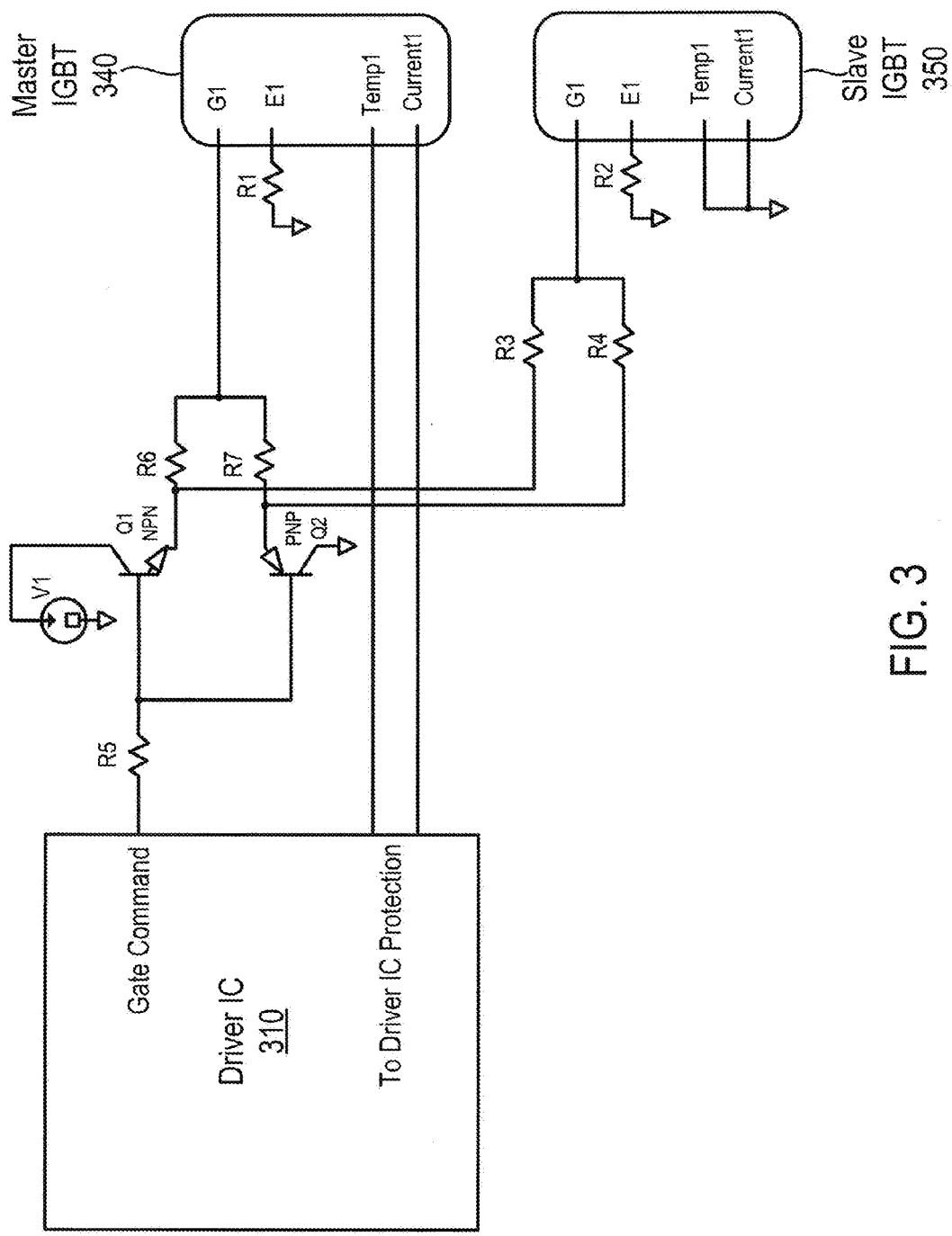
FIG. 3 is a circuit diagram illustrating an exemplary configuration of connecting a master IGBT switch, a slave IGBT switch, and a driver IC, according to some disclosed embodiments.

FIG. 3 is a circuit diagram illustrating an exemplary configuration of connecting a master IGBT switch, a slave IGBT switch, and a driver IC, according to some disclosed embodiments. As shown in FIG. 3, an exemplary driver IC 310 may include a gate command pin and one or more protection pins. Driver IC 310 may include built-in circuit(s) to provide overcurrent and/or overheating protection. A master IGBT switch 340 and a slave IGBT switch 350 are connected in parallel (e.g., similar to AH1 and AH2 in FIG. 2). The gate terminals of both IGBT switches are connected to the gate command pin of driver IC 310. In some embodiments, the gate terminals may be connected to the gate command pin through a common buffer stage. Therefore, driver IC 310 may control switching operations (e.g., turning on/off) of both IGBT switches by supplying a gate command through the gate command pin to the gate terminals of both IGBT switches. Master IGBT switch 340 may include a current sensor and a temperature sensor. In some embodiments, the current sensor may be an emitter current mirror. The temperature sensor may be an on die temperature sensor. The current sensor and temperature sensor of master IGBT switch 340 may be connected to the corresponding pin(s) of driver IC 310 for monitoring the operation conditions. Slave IGBT switch 350 may also include a current sensor and a temperature sensor but they are not connected to driver IC 310 and are grounded.

Using a single driver circuit to control a pair of IGBT switches connected in parallel may reduce cost and may also provide for relatively equal current sharing between the pair of IGBT switches.

Referring back to FIG. 2, master devices are indicated by dashed-line boxes. For each pair of IGBT switches that are connected in parallel, one IGBT switch is selected as the master device and the other is selected as the slave device. For the parallel connection configuration using two hexpack power modules as shown in FIG. 2, three IGBT switches in each hexpack power module may be selected as master devices. For example, for each phase in a hex power module, if the upper IGBT switch is selected as a master device, then the lower IGBT switch is selected as a slave device. Similarly, if the lower IGBT switch is selected as a master device, then the upper IGBT switch is selected as a slave device. In FIG. 2, for instance, AH1 is selected as a master device. Accordingly, AH2 is selected as the slave device of the AH1-AH2 pair connected in parallel. In addition, because AH1 is the upper device in phase A of Module 1, the lower device in phase A of Module 1—AL1—is selected as a slave device of the AL1-AL2 pair connected in parallel. Similar selection processes can be applied to other phases. In some embodiments, for each hexpack power module, at least one of the upper IGBT switches may be selected as a master device and at least one of the lower IGBT switches may be selected as a master device. For example, FIG. 2 shows that in Module 1, two upper IGBT switches (AH1 and BH1) are selected as master devices and one lower IGBT switch (CL1) is selected as a master device.

The above disclosed master-slave device selection method can equally spread protection circuits (e.g., only used in master devices) amongst the two hexpack power modules. For example, the selection method can ensure that at least one IGBT switch in each phase of each module is used for protection purposes such that every phase is protected against shoot-through events. A shoot-through event can happen when both upper and lower IGBT switches are accidentally turned on at the same time. If a master IGBT switch fails, there will always be another master device in a complementary position (upper and lower are complementary positions) of the same phase but in another module, which will detect shoot-through event. Another condition is when one module's AC output terminals become disconnected, and the other module can potentially carry the entire current of the load. This can cause the IGBT switches of the working module to overheat. Because each phase has a master IGBT switch in each module, the temperature sensor(s) of the master device(s) should be able to detect this overheating condition to protect the IGBT switches.

While FIG. 2 illustrates a parallel connection method using two hexpack power modules, similar approaches can also be applied to half-bridge modules or individual IGBT switches.

Figure 4:
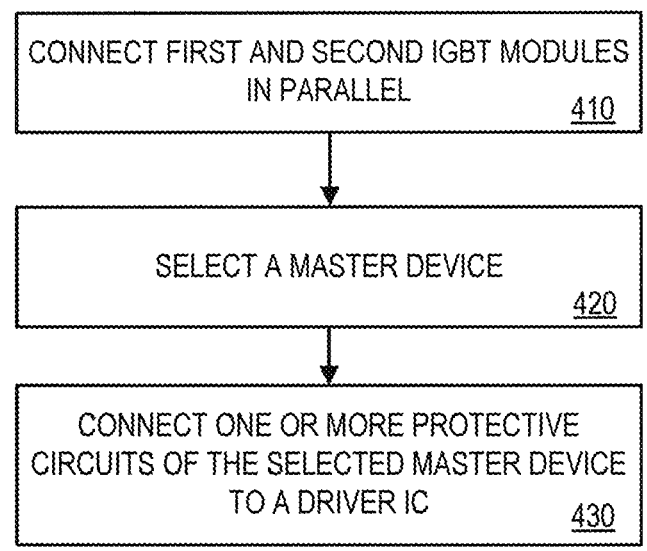
FIG. 4 is a flow chart of an exemplary method for interconnecting IGBT modules, according to some disclosed embodiments.

FIG. 4 is a flow chart of an exemplary method 400 for interconnecting IGBT modules, according to some disclosed embodiments. Method 400 includes a plurality of steps, some of which may be optional.

In step 410, method 400 may include connecting first and second IGBT modules in parallel (e.g., connecting modules 202 and 204 in parallel). Each IGBT module may include one or more IGBT switches (e.g., modules 202 and 204 each includes six IGBT switches). Connecting first and second IGBT modules in parallel may include connecting each pair of corresponding IGBT switches in parallel (e.g., connecting AH1 and AH2 in parallel). Connecting a pair of corresponding IGBT switches in parallel may include connecting the collector terminals of both IGBT switches together, connecting the emitter terminals of both IGBT switches together, and connecting the gate terminals of both IGBT switches to a driver circuit (e.g., driver IC 310). Connecting first and second IGBT modules in parallel may also include connecting corresponding phase outputs of the first and second IGBT modules together (e.g., phases A, B, and C of modules 202 and 204 are respectively connected together).

In step 420, method 400 may include selecting a master device between the pair of IGBT switches connected in parallel. At least one master device may be selected for each phase of each IGBT module. For example, FIG. 2 shows that master devices (denoted by dashed-line boxes) are selected for each of the A, B, and C phases of each module 202/204. In addition, at least one master device may be selected for the upper devices of each IGBT module and at least one master device may be selected for the lower devices of each IGBT module. For example, FIG. 2 shows that each of the upper and lower side of module 202 (and similarly 204) includes at least one master device.

In step 430, method 400 may include connecting one or more protective circuits of the selected master device to the driver circuit for monitoring operation conditions of the first and second IGBT modules connected in parallel. The one or more protective circuits may include a current protection circuit (e.g., an emitter current mirror), a temperature protection circuit (e.g., an on die temperature sensor), etc.

Some aspects of the present disclosure are directed to overcurrent protection of IGBT switches. During switching operations, electrical current flowing through an IGBT switch can be monitored to prevent overcurrent that may damage the IGBT switch. In some embodiments, an IGBT switch may include a built-in current sensor. For example, in such an IGBT switch, a few cells may be combined to create a sense-emitter, generating two parallel current arms: a sensing arm and a main arm, with the current in the sensing arm a fraction of, and substantially proportional to, the current in the main arm. The sensing current can be provided by the IGBT switch through a current sensing terminal and converted into a voltage signal by a current sensing circuit. The voltage signal can then be input into a driver circuit (e.g., driver IC 310 shown in FIG. 3), and compared with a threshold value to trigger an overcurrent fault signal if the voltage signal exceeds the threshold value.

When multiple IGBT modules are connected in parallel, for example, as illustrated in FIG. 2, current is designed to flow through IGBT switches connected in parallel, preferably in equal splits. In some embodiments, to simplify control and save cost, the current sensor of only one IGBT switch (can be referred to as the master IGBT switch) is used for monitoring purposes, such as monitoring overcurrent events. The remaining IGBT switch(es) that are connected with the master IGBT switch in parallel can be referred to as slave IGBT switch(es). For example, FIG. 3 illustrates an exemplary circuit configuration for driving parallel connected master IGBT switch 340 and slave IGBT switch 350. As shown in FIG. 3, the current sensing terminal of master IGBT switch 340 is connected to driver IC 310, while the current sensing terminal of slave IGBT switch 350 is grounded and not used for monitoring purposes.

Overcurrent protection in IGBT switches connected in parallel may be affected by parasitic inductance imbalance caused by, for example, bus bar or connecting trace length/shape difference. This effect can be described in reference to FIG. 5A, in which an exemplary driving circuit is shown.

Figure 5A:
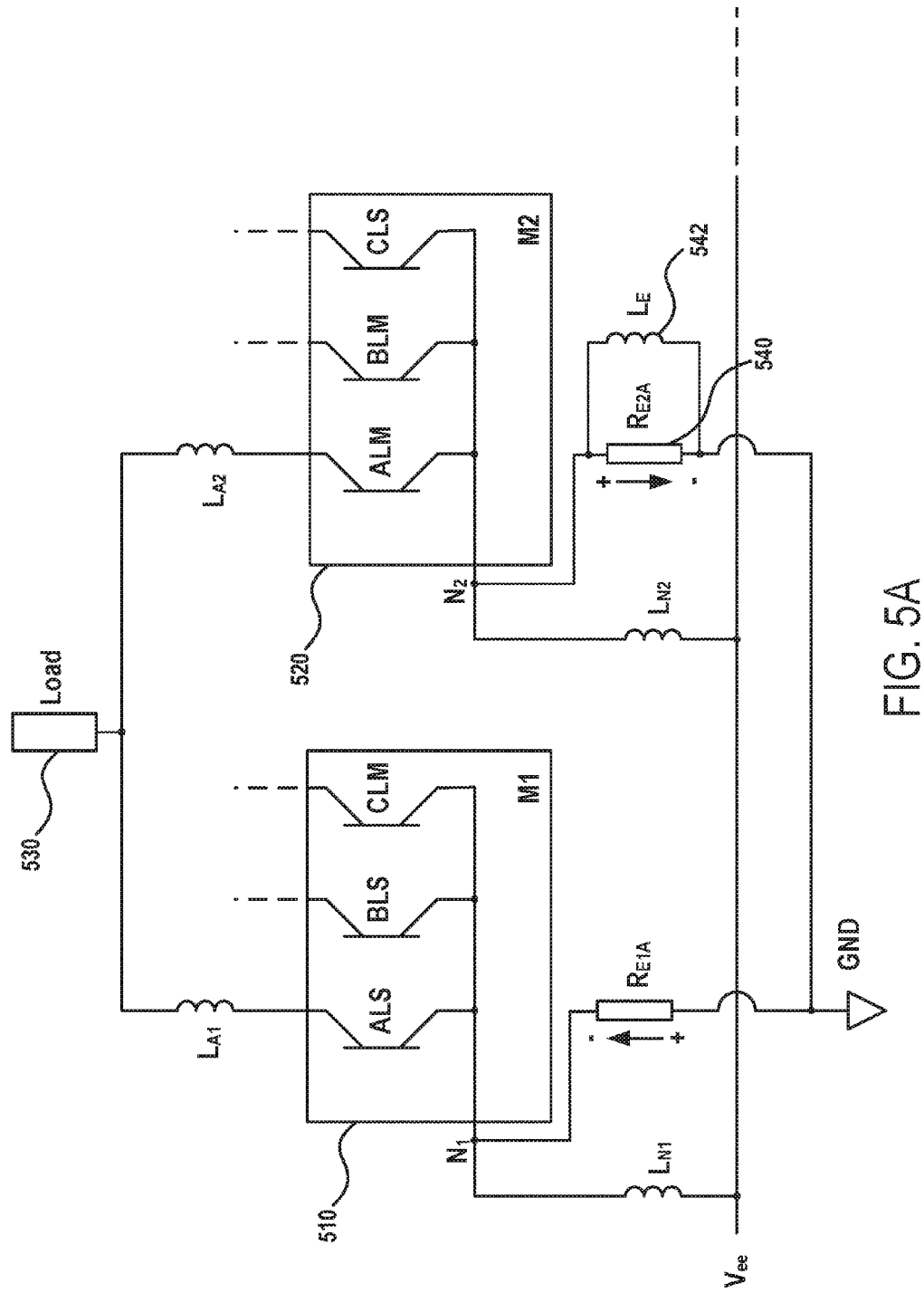
FIG. 5A is a circuit diagram illustrating an exemplary driving circuit, according to some disclosed embodiments.

FIG. 5A illustrates a partial inverter (e.g., only the lower IGBT switches are shown) employing parallel connected IGBT modules M1 (510) and M2 (520). Modules M1 and M2 may be hexpack power modules, each including six IGBT switches. The six IGBT switches may include three upper devices and three lower devices, as illustrated in, for example, FIG. 2. The lower IGBT switches shown in FIG. 5A are connected in parallel for each phase A, B, and C. For example, the collector terminals of ALS and ALM are connected together and connected to a load 530. The term "ALS" indicates that the IGBT switch shown in M1, left hand side, is in phase A, is a lower IGBT device, and is a slave IGBT; while the term "ALM" indicates that the IGBT switch shown in M2, left hand side, is in phase A, is a lower IGBT device, and is a master IGBT. The term "BLS/BLM" and "CLM/CLS" refer to similar meanings for phase B and C, respectively. In actual three phase configuration, the other pairs of IGBT switches BLS/BLM and CLM/CLS are similarly connected at their respective collector terminals. However, because the parasitic inductance imbalance effect is similar for each phase, FIG. 5A only shows phase A connection as an example for simplicity. Similarly, in actual three phase configuration, load 530 may be a three-phase load and include respective phase terminals for connecting with a corresponding phase output (A, B, or C) of the parallel connected IGBT modules.

When connecting M1 and M2 in parallel, connection bus bars or connection traces may be used to electrically connect the respective terminals of M1 and M2 together and electrically connect M1/M2 to load 530 and/or driver IC 310. For example, when M1 and M2 are both mounted on a printed circuit board (PCB), copper traces printed on the PCB may be used to establish electrical connections among various components and terminals. In another example, heavy gauge bus bars may be used for high power interconnections, and wirings on a printed wiring board (PWB) may be used for low level signal interconnections (e.g., gate driving signals, current sensing signals, temperature sensing signals, etc.). As used herein, the term "bus bar" is used to refer to any types of connection means (wire, trace, etc.) to establish electrical connection between two components or terminals.

The physical layout of the inverter, including component placement and bus bar routing, can influence the various parasitic inductances present in the unit. In some embodiments, bus bars having different lengths and/or shapes may have different parasitic inductance. The parasitic inductance may affect electrical behavior of a driving circuit. For example, referring to FIG. 5A, the bus bars connecting the collector terminals of ALS/ALM and load 530 can be made relatively symmetrical such that the parasitic inductance $L_{A1}$ and $L_{A2}$ associated with each bus bar are approximately the same. However, the bus bars connecting the emitter terminals of ALS/ALM and $V_{ee}$, on the other hand, may be difficult to be symmetrical. For example, the parasitic inductance of the bus bar connecting with the master IGBT switch may be higher than the parasitic inductance of the bus bar connecting with the slave IGBT switch. That is, in the example shown in FIG. 5A, $L_{N2}$ may be higher than $L_{N1}$. During a switching transient period, for example, when ALS/ALM turns on or off, current may be directed to or drawn away from ALS/ALM, causing a large change in current (i.e., di/dt is high). The high di/dt can cause a voltage differential between $N_1$ and $N_2$ due to different parasitic inductance $L_{N2}$ and $L_{N1}$. In the example shown in FIG. 5A, the voltage at $N_2$ is higher than the voltage at $N_1$.

To attenuate any oscillatory current during switching operations (e.g., turning on/off), a Kelvin emitter resistor may be provided to each phase, connecting the emitter of an IGBT switch to the ground (e.g., gate driver ground). For example, FIG. 5A shows Kelvin emitter resistors $R_{E1A}$ (between $N_1$ and ground) and $R_{E2A}$ (between $N_2$ and ground). The voltage differential between $N_2$ and $N_1$ may induce a current in the Kelvin emitter resistors, flowing from $N_2$ through $R_{E2A}$ and $R_{E1A}$ to $N_1$, as shown in FIG. 5A by the arrows accompanying resistors $R_{E2A}$ and $R_{E1A}$. This induced Kelvin emitter current may affect overcurrent protection, as described in greater detail below in reference to FIG. 5B.

Figure 5B:
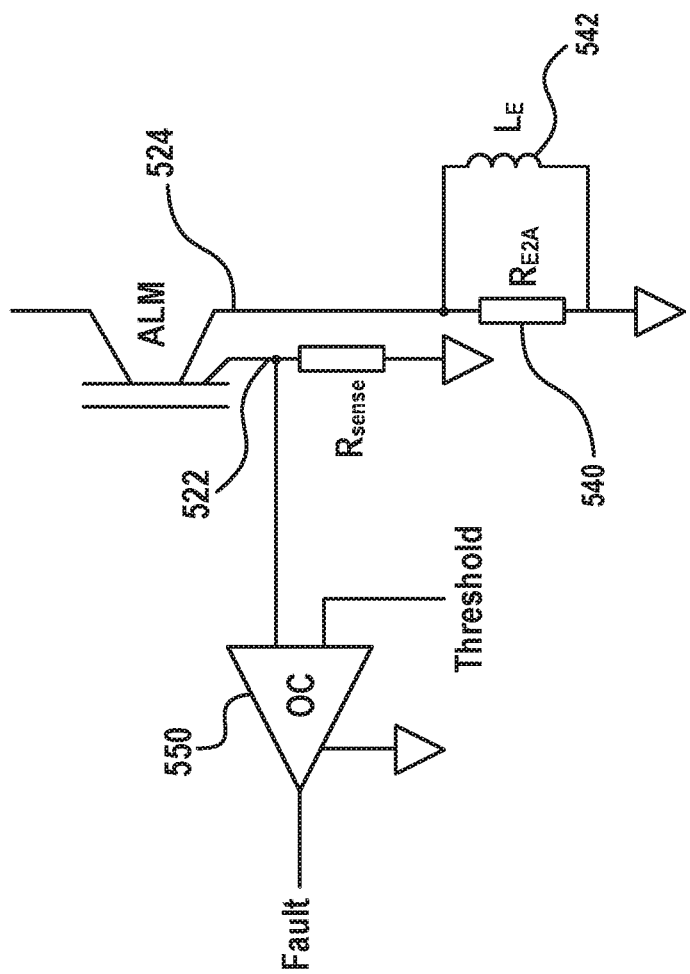
FIG. 5B shows an overcurrent protection portion of the exemplary circuit diagram of FIG. 5A, according to some disclosed embodiments.

FIG. 5B shows an overcurrent protection portion (omitted in FIG. 5A) to illustrate the impact of the Kelvin emitter current (e.g., induced by the voltage differential between N1 and N2) on overcurrent protection. In FIG. 5B, a current sensing terminal 522 of IGBT switch ALM is shown (omitted in FIG. 5A) below the main emitter 524. Current sensing terminal 522 can provide a small sensing current substantially proportional to the current flowing through main emitter 524. As shown in FIG. 5B, current sensing terminal 522 is connected to a current sensing resistor $R_{sense}$ to convert the sensing current into a current sensing signal, e.g., a voltage signal. The current sensing signal is input to an overcurrent protection circuit 550. For example, overcurrent protection circuit 550 may be a component (e.g., a comparator) of driver IC 310. Overcurrent protection circuit 550 may receive the current sensing signal, compare the signal with a threshold, and output a fault signal when the current sensing signal exceeds the threshold.

As described earlier in reference to FIG. 5A, when a Kelvin emitter current is induced due to parasitic inductance imbalance, a voltage drop is present across Kelvin emitter resistor $R_{E2A}$ (540). The voltage drop effectively raises the voltage of the emitter with respect to the gate driver return, and in turn the voltage at terminal 522, generating an offset between the actual current sensing signal proportional to the emitter current and the voltage signal received by the overcurrent protection circuit 550 for comparison with the threshold. This offset may cause the triggering of overcurrent protection circuit 550 prematurely (e.g., in case when the voltage across resistor 540 raises the emitter voltage). For example, when the overcurrent protection circuit 550 is configured to generate the fault signal when the emitter current exceeds 800 A, the Kelvin emitter current may cause the overcurrent protection circuit 550 to be triggered at about 600 A, creating false alarms. On the other hand, depending upon the polarity of the Kelvin emitter resistor voltage drop, the offset may reduce the amplitude of the overcurrent sensing signal. In this case, the overcurrent triggering point will be higher than desired. The magnitude of the triggering point error may depend on the parasitic inductance, the emitter resistance, as well as the di/dt. In low di/dt situations, the effect may be negligible. However, in fault cases with high di/dt the effect can be significant. It is possible that the overcurrent detection does not function at the desired threshold, resulting in damage to the inverter unit and/or the load.

The present application discloses technical solutions to mitigate the overcurrent protection triggering threshold error issue. While Kelvin emitter resistor 540 causes the voltage raise (or drop) at the emitter, resistor 540 also functions as a damping resistor during switching operations to attenuate any oscillatory current. Therefore, eliminating resistor 540 may cause other problems. The inventors observed that the switching oscillatory current damping period is generally very short. For example, the total duration is usually within 2 microseconds. Therefore, embodiments disclosed herein provide a current sensing signal correction circuit to preserve the current attenuation function of resistor 540 within the switching oscillatory current damping period, and effectively short-circuit resistor 540 after the damping period but before overcurrent protection circuit 500 reacts to the current sensing signal.

FIGS. 5A and 5B show such an exemplary current sensing signal correction circuit. For example, as shown in FIG. 5B, an exemplary current sensing signal correction circuit includes an inductor $L_E$ 542 connected in parallel with resistor 540 to reduce the offset in the current sensing signal received by overcurrent protection circuit 550. Inductor 542 and resistor 540 form a filter circuit/network with a natural time constant. The time constant of the filter circuit can be configured to be longer than the switching oscillatory current damping period (e.g., about 2 microseconds) and shorter than the response time of overcurrent protection circuit 550. Therefore, during normal switching operations, resistor 540 can still provide current attenuation during the damping period. When overcurrent protection circuit 550 starts to compare the current sensing signal with the threshold, however, inductor 542 effectively short-circuits resistor 540 to reduce or eliminate the voltage drop across resistor 540, thereby reducing or eliminating the offset caused by Kelvin emitter current in the current sensing signal.

In an exemplary embodiment, the resistance of resistor 540 is set to 0.5 Ohm, and the response time of overcurrent protection circuit 550 (e.g., the RC filter response time) is set to 4 microseconds. The time constant of the LR filter circuit formed by resistor 540 and inductor 542 should be set to larger than 2 microseconds and shorter than 4 microseconds. The time constant of the LR filter circuit can be represented as $\tau=L/R$. Therefore, L can be set between $0.5 \times 2 \times 10^{-6}=1$ uH and $0.5 \times 4 \times 10^{-6}=2$ uH.

While FIGS. 5A and 5B describe an exemplary current sensing signal correction circuit in the context of the lower leg switching devices, a similar current sensing signal correction circuit may also be used for upper leg switching devices. In the upper leg, a similar situation can occur due to imbalance in the AC output bus bar connection, which may result in Kelvin emitter current and similar offset in the current sensing signal.

Figure 6:
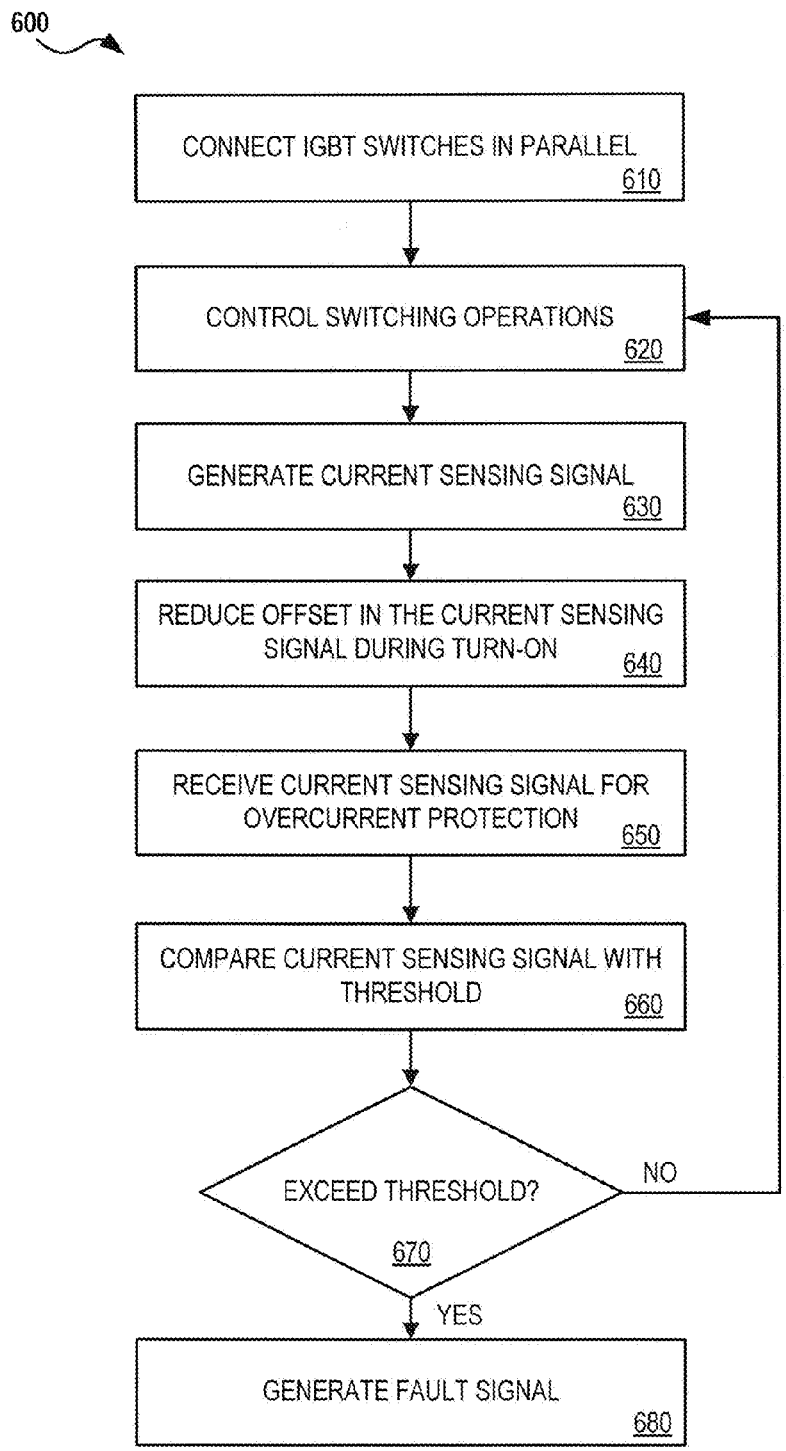
FIG. 6 is a flow chart of an exemplary method for driving a load using parallel-connected IGBT modules, according to some disclosed embodiments.

FIG. 6 is a flow chart showing steps of an exemplary method 600 for driving a load using parallel connected IGBT modules, according to various embodiments. Method 600 include a plurality of steps, some of which may be optional.

In step 610, method 600 may include connecting IGBT switches in parallel. For example, as shown in FIG. 2, two IGBT switches may be connected in parallel by connecting their collector terminals together, connecting their emitter terminals together, and connecting their gate terminals to a gate command terminal of driver IC 310. Other interconnecting methods disclosed in this application may also be used to establish parallel connection of IGBT switches.

In step 620, driver IC 310 may control switching operations of the parallel connected IGBT switches. For example, as shown in FIG. 3, gate commands may be provided by driver IC 310 to the gate terminals of the parallel connected IGBT switches to control turning on/off operations.

In step 630, a master IGBT switch of the parallel connected IGBT switches may generate a sensing current through a current sensing terminal (e.g., terminal 522). The sensing current may be converted to a current sensing signal by a current sensing circuit (e.g., $R_{sense}$). The current sensing signal may be subject to an offset caused by Kelvin emitter current due to parasitic inductance imbalance, as described above.

In step 640, a current sensing signal correction circuit (e.g., inductor 542) may reduce the offset during a switching transient period. For example, inductor 542 may short-circuit resistor 540 after attenuating any oscillatory current during turn-on (including the turning on transient period and the on state) and before overcurrent protection circuit 550 starts to compare the current sensing signal with the threshold.

Overcurrent protection circuit 550 may receive the corrected current sensing signal in step 650 and compare it with the threshold in step 660. In step 670, if the current sensing signal exceeds the threshold, method 600 proceeds to step 680, in which overcurrent protection circuit 550 generates a fault signal. Otherwise, method 600 loops back to step 620 to continue the switching operations.

While various embodiments have been described above, it should be understood that they have been presented by way of example only, and not limitation. The descriptions are not intended to limit the scope of the technology to the particular forms set forth herein. Thus, the breadth and scope of a preferred embodiment should not be limited by any of the above-described exemplary embodiments.

It should be understood that the above description is illustrative and not restrictive. To the contrary, the present descriptions are intended to cover such alternatives, modifications, and equivalents as may be included within the spirit and scope of the technology as defined by the appended claims and otherwise appreciated by one of ordinary skill in the art. The scope of the technology should, therefore, be determined not with reference to the above description, but instead should be determined with reference to the appended claims along with their full scope of equivalents.

The invention claimed is:

1. A driving circuit for driving a load, comprising:
   first and second switching devices electrically connected with each other in parallel;
   a current sensing circuit configured to generate a current sensing signal indicating a value of a current flowing through the first switching device, the current sensing signal including an offset caused by parasitic inductance imbalance in electrical connections connecting the first and second switching devices;
   a driver circuit electrically connected to the first and second switching devices and configured to control switching operations of the first and second switching devices, the driver circuit including an overcurrent protection circuit electrically connected to the current sensing circuit for receiving the current sensing signal;
   a current sensing signal correction circuit configured to reduce the offset in the current sensing signal received by the overcurrent protection circuit during a switching transient period; and
   a Kelvin emitter resistor electrically connected to a first emitter terminal of the first switching device,
   wherein the current sensing signal correction circuit is electrically connected with the Kelvin emitter resistor in parallel.

2. The driving circuit of claim 1, wherein the current sensing signal correction circuit includes an inductor, the inductor and the Kelvin emitter resistor forming a filter circuit.

3. The driving circuit of claim 2, wherein a time constant of the filter circuit is longer than a switching oscillatory current damping period.

4. The driving circuit of claim 3, wherein the Kelvin emitter resistor is configured to attenuate an oscillatory current during the switching oscillatory current damping period.

5. The driving circuit of claim 2, wherein a time constant of the filter circuit is shorter than a response time of the overcurrent protection circuit.

6. The driving circuit of claim 2, wherein:
   the overcurrent protection circuit is configured to compare the current sensing signal with a predetermined threshold; and
   the inductor is configured to short-circuit the Kelvin emitter resistor when the overcurrent protection circuit compares the current sensing signal with the predetermined threshold.

7. The driving circuit of claim 1, wherein the switching transient period includes a turning on period of the first switching device.

8. The driving circuit of claim 1, wherein the first and second switching devices are insulated-gate bipolar transistors (IGBTs).

9. The driving circuit of claim 1, wherein
   the first switching device includes a first collector terminal, the first emitter terminal, a current sensing terminal, and a first gate terminal; and
   the second switching device includes a second collector terminal, a second emitter terminal, and a second gate terminal,
   wherein:
      the first and second collector terminals are electrically connected;
      the first and second gate terminals are electrically connected to a gate command terminal of the driver circuit;
      the first and second emitter terminals are electrically connected; and
      the current sensing terminal is electrically connected with the current sensing circuit.

10. A method for driving a load, comprising:
   electrically connecting first and second switching devices in parallel;
   generating, by a current sensing circuit, a current sensing signal indicating a value of a current flowing through the first switching device, the current sensing signal including an offset caused by parasitic inductance imbalance in electrical connections connecting the first and second switching devices;
   reducing, by a current sensing signal correction circuit, the offset in the current sensing signal during a switching transient period;
   receiving, by an overcurrent protection circuit of a driver circuit, the current sensing signal having the reduced offset for protecting the first switching device from overcurrent;
   electrically connecting a Kelvin emitter resistor to an emitter terminal of the first switching device; and
   electrically connecting the current sensing signal correction circuit with the Kelvin emitter resistor in parallel.

11. The method of claim 10, wherein the current sensing signal correction circuit includes an inductor, and the method further comprises:
   forming a filter circuit using the inductor and the Kelvin emitter resistor.

12. The method of claim 11, further comprising:
setting a time constant of the filter circuit to be longer than a switching oscillatory current damping period.

13. The method of claim 11, further comprising:
setting a time constant of the filter circuit to be shorter than a response time of the overcurrent protection circuit.

14. The method of claim 11, further comprising:
comparing, by the overcurrent protection circuit, the current sensing signal with a predetermined threshold; and
short-circuiting the Kelvin emitter resistor using the inductor when the overcurrent protection circuit compares the current sensing signal with the predetermined threshold.

15. An inverter for driving a motor of an electric vehicle, comprising:
first and second insulated-gate bipolar transistor (IGBT) switches electrically connected with each other in parallel;
a current sensing circuit configured to generate a current sensing signal indicating a value of a current flowing through the first IGBT switch, the current sensing signal including an offset caused by parasitic inductance imbalance in electrical connections connecting the first and second IGBT switches;
a driver circuit electrically connected to the first and second IGBT switches and configured to control switching operations of the first and second IGBT switches, the driver circuit including an overcurrent protection circuit electrically connected to the current sensing circuit for receiving the current sensing signal;
a current sensing signal correction circuit configured to reduce the offset in the current sensing signal received by the overcurrent protection circuit during a switching transient period; and
a Kelvin emitter resistor electrically connected to an emitter terminal of the first IGBT switch,
wherein the current sensing signal correction circuit is electrically connected with the Kelvin emitter resistor in parallel.

16. The inverter of claim 15, wherein current sensing signal correction circuit includes an inductor electrically connected in parallel with the Kelvin emitter resistor.

17. The inverter of claim 16, wherein a time constant of a filter circuit including the inductor and the Kelvin emitter resistor is longer than a switching oscillatory current damping period and shorter than a response time of the overcurrent protection circuit.

* * * * *